(12) United States Patent
Itoh

(10) Patent No.: US 10,895,791 B2
(45) Date of Patent: Jan. 19, 2021

(54) ACTIVE MATRIX SUBSTRATE AND LIQUID CRYSTAL DISPLAY DEVICE

(71) Applicant: SHARP KABUSHIKI KAISHA, Sakai (JP)

(72) Inventor: Ryohki Itoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 29 days.

(21) Appl. No.: 16/365,116

(22) Filed: Mar. 26, 2019

(65) Prior Publication Data

US 2019/0302559 A1 Oct. 3, 2019

Related U.S. Application Data

(60) Provisional application No. 62/649,707, filed on Mar. 29, 2018.

(51) Int. Cl.
*G02F 1/1362* (2006.01)
*H01L 27/12* (2006.01)
*G02F 1/1368* (2006.01)
*G02F 1/1337* (2006.01)

(52) U.S. Cl.
CPC ...... *G02F 1/136286* (2013.01); *G02F 1/1337* (2013.01); *G02F 1/1368* (2013.01); *H01L 27/124* (2013.01); *G02F 2001/136222* (2013.01); *G02F 2201/123* (2013.01)

(58) Field of Classification Search
CPC .............................................. G02F 1/136213
See application file for complete search history.

(56) References Cited

U.S. PATENT DOCUMENTS

| | | | |
|---|---|---|---|
| 2004/0109117 A1* | 6/2004 | Lee | G02F 1/1393 349/129 |
| 2006/0061700 A1* | 3/2006 | Chung | G02F 1/136213 349/38 |
| 2009/0225246 A1 | 9/2009 | Shoraku et al. | |
| 2009/0284703 A1 | 11/2009 | Shoraku et al. | |
| 2011/0043741 A1 | 2/2011 | Hirato | |
| 2012/0002144 A1 | 1/2012 | Shoraku et al. | |

(Continued)

FOREIGN PATENT DOCUMENTS

| | | |
|---|---|---|
| WO | 2006/132369 A1 | 12/2006 |
| WO | 2007/114471 A1 | 10/2007 |
| WO | 2009/130908 A1 | 10/2009 |

*Primary Examiner* — Alexander P Gross
(74) *Attorney, Agent, or Firm* — ScienBiziP, P.C.

(57) ABSTRACT

An active matrix substrate includes first and second gate bus lines each extending in a first direction; first and second source bus lines each extending in a second direction; a pixel electrode; and an auxiliary capacitance bus line. The conductive line branch portions of the auxiliary capacitance bus line include a first conductive line branch portion extending in the second direction, a second conductive line branch portion extending in a direction opposite to the first conductive line branch portion, a third conductive line branch portion extending in the second direction, and a fourth conductive line branch portion extending in a direction opposite to the third conductive line branch portion. In the first direction, one of the first and second conductive line branch portions has a longer length than the other, and one of the third and fourth conductive line branch portions has a longer length than the other.

9 Claims, 12 Drawing Sheets

(56) References Cited

U.S. PATENT DOCUMENTS

2013/0114029 A1    5/2013   Shoraku et al.
2016/0026046 A1*   1/2016   Itoh .................. G02F 1/136286
                                                              257/43

* cited by examiner

ACTIVE MATRIX SUBSTRATE AND LIQUID CRYSTAL DISPLAY DEVICE

CROSS-REFERENCE TO RELATED APPLICATIONS

The present application claims priority under 35 U.S.C. § 119 to U.S. Provisional Patent Application No. 62/649,707 filed on Mar. 29, 2018, the contents of which are incorporated herein by reference in their entirety.

BACKGROUND OF THE INVENTION

Field of the Invention

The present invention relates to active matrix substrates and liquid crystal display devices.

Description of Related Art

Liquid crystal display devices utilize a liquid crystal layer (liquid crystal molecules) for providing image display. A typical display style of a liquid crystal display device is as follows. A liquid crystal layer held between a pair of substrates is irradiated with light from a backlight. Voltage is then applied to the liquid crystal layer to change the alignment of liquid crystal molecules, thereby controlling the amount of light transmitted through the liquid crystal layer.

Such liquid crystal display devices, having advantages such as a low profile, light weight, and low power consumption, are used in applications such as smartphones, tablet computers, and automotive navigation systems. These applications require improved viewing angle characteristics. In response to the requirement, for example, alignment division techniques have been studied in which one pixel region is divided into multiple domains (alignment regions) and liquid crystal molecules are aligned at different azimuths in the respective domains (e.g., WO 2009/130908, WO 2007/114471, WO 2006/132369).

BRIEF SUMMARY OF THE INVENTION

Unfortunately, when such an alignment division technique is employed, dark line(s) (part(s) with a low transmittance) may appear at end(s) of a pixel region (pixel electrode). An electric field generated may shift the inclination azimuth (alignment azimuth) of liquid crystal molecules from a predetermined azimuth at an end of a pixel region. The region with a shifted inclination azimuth may be recognized as a dark line. Recent liquid crystal display devices have enhanced definition, which triggers a recent demand for reducing the pixel region area. A reduced pixel region area increases the area ratio of a dark line to the pixel region to possibly deteriorate the display quality such as a level of afterimage (image sticking) and response speed.

The present invention has been made under the current situation in the art and aims to provide an active matrix substrate capable of improving the display quality and a liquid crystal display device including the active matrix substrate.

The inventor made various studies on methods for suppressing deterioration in display quality caused by a dark line that appears at an end of a pixel region to find that use of an auxiliary capacitance bus line for reducing parasitic capacitance between a pixel electrode and a source bus line can efficiently shield the dark line appearance region from light. The inventor thereby found a measure against the issue to arrive at the present invention.

In other words, an aspect of the present invention may be an active matrix substrate including: a first gate bus line and a second gate bus line each extending in a first direction; a first source bus line and a second source bus line each extending in a second direction intersecting the first direction; a pixel electrode disposed in a region partitioned by the first gate bus line, the second gate bus line, the first source bus line, and the second source bus line; and an auxiliary capacitance bus line including a conductive line main portion and conductive line branch portions branching from the conductive line main portion, the conductive line main portion extending in the first direction to intersect the first source bus line and the second source bus line, the conductive line branch portions including a first conductive line branch portion superimposed with a first end of the pixel electrode and extending in the second direction along the first source bus line, a second conductive line branch portion superimposed with the first end of the pixel electrode and extending in a direction opposite to the first conductive line branch portion, a third conductive line branch portion superimposed with a second end of the pixel electrode and extending in the second direction along the second source bus line, and a fourth conductive line branch portion superimposed with the second end of the pixel electrode and extending in a direction opposite to the third conductive line branch portion, one of the first conductive line branch portion and the second conductive line branch portion having a longer length in the first direction than the other conductive line branch portion, one of the third conductive line branch portion and the fourth conductive line branch portion having a longer length in the first direction than the other conductive line branch portion.

Another aspect of the present invention may be a liquid crystal display device including: the active matrix substrate; a counter substrate facing the active matrix substrate; and a liquid crystal layer held between the active matrix substrate and the counter substrate.

The present invention can provide an active matrix substrate capable of improving the display quality and a liquid crystal display device including the active matrix substrate.

DETAILED DESCRIPTION OF THE INVENTION

The present invention is described below in more detail based on embodiments with reference to the drawings. The embodiments, however, are not intended to limit the scope of the present invention. The configurations employed in the embodiments may appropriately be combined or modified within the spirit of the present invention.

The expression "X to Y" as used herein means "X or more and Y or less".

Embodiment 1

Figure 1:
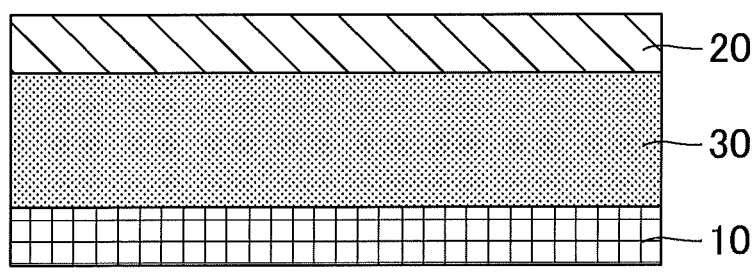
FIG. 1 is a schematic cross-sectional view of a liquid crystal display device of Embodiment 1.

A liquid crystal display device of Embodiment 1 is described in the following with reference to FIG. 1. FIG. 1 is a schematic cross-sectional view of a liquid crystal display device of Embodiment 1.

A liquid crystal display device 1 includes an active matrix substrate 10, a counter substrate 20 facing the active matrix substrate 10, and a liquid crystal layer 30 held between the active matrix substrate 10 and the counter substrate 20.
<Active Matrix Substrate>

Figure 2:
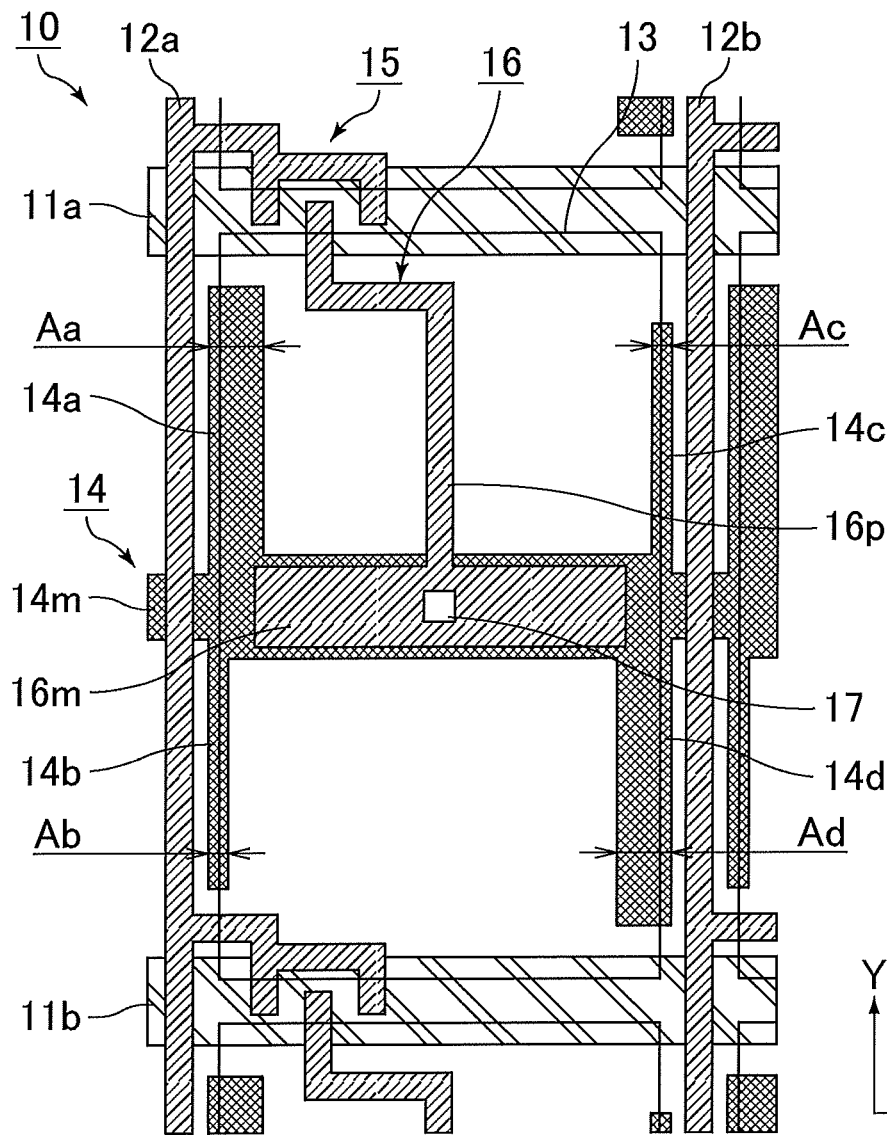
FIG. 2 is a schematic plan view of a part of the active matrix substrate of Embodiment 1.

FIG. 2 is a schematic plan view of a part of the active matrix substrate of Embodiment 1. As shown in FIG. 2, the active matrix substrate 10 includes a first gate bus line 11a and a second gate bus line 11b each extending in an X direction, a first source bus line 12a and a second source bus line 12b each extending in a Y direction intersecting (in FIG. 2, being perpendicular to) the X direction, a pixel electrode 13, and an auxiliary capacitance bus line 14. In the active matrix substrate 10, multiple structure units as shown in FIG. 2 are arranged in the X direction and the Y direction to form a matrix pattern.

The expression "a member extends in a certain direction" as used herein means that the member substantially extends in the direction and involves the state where the member linearly extends and the state where the member extends in a zigzagged manner.

The first gate bus line 11a and the second gate bus line 11b may be formed from a metal material such as aluminum, copper, titanium, molybdenum, or chromium.

The first source bus line 12a and the second source bus line 12b may be formed from a metal material such as aluminum, copper, titanium, molybdenum, or chromium.

The pixel electrode 13 is disposed in a planar form in a region partitioned by the first gate bus line 11a, the second gate bus line 11b, the first source bus line 12a, and the second source bus line 12b.

The pixel electrode 13 may be formed from a transparent conductive material such as indium tin oxide (ITO) or indium zinc oxide (IZO).

The auxiliary capacitance bus line 14 includes a conductive line main portion 14m, a first conductive line branch portion 14a, a second conductive line branch portion 14b, a third conductive line branch portion 14c, and a fourth conductive line branch portion 14d. The first conductive line branch portion 14a, the second conductive line branch portion 14b, the third conductive line branch portion 14c, and the fourth conductive line branch portion 14d each branch from the conductive line main portion 14m.

The conductive line main portion 14m extends in the X direction to intersect (in FIG. 2, be perpendicular to) the first source bus line 12a and the second source bus line 12b.

The first conductive line branch portion 14a is superimposed with an end (left end) of the pixel electrode 13 via an insulating film and extends in the Y direction along the first source bus line 12a. The first conductive line branch portion 14a is not superimposed with the first source bus line 12a.

The second conductive line branch portion 14b is superimposed with the end (left end) of the pixel electrode 13 via the insulating film and extends in the direction opposite to the first conductive line branch portion 14a. The second conductive line branch portion 14b is not superimposed with the first source bus line 12a.

The third conductive line branch portion 14c is superimposed with an end (right end) of the pixel electrode 13 via the insulating film and extends in the Y direction along the second source bus line 12b. The third conductive line branch portion 14c is not superimposed with the second source bus line 12b.

The fourth conductive line branch portion 14d is superimposed with the end (right end) of the pixel electrode 13 via the insulating film and extends in the direction opposite to the third conductive line branch portion 14c. The fourth conductive line branch portion 14d is not superimposed with the second source bus line 12b.

The expression "two members are superimposed with each other" as used herein means that, in a plan view, the two members at least partly overlap each other and involves the state where the disposed region of one member is encompassed by the disposed region of the other member and the state where the disposed region of one member is partly shifted from the disposed region of the other member.

In the active matrix substrate 10, only the conductive line main portion 14m of the auxiliary capacitance bus line 14 intersects the first source bus line 12a and the second source bus line 12b. This structure suppresses deterioration in in-plane counter distribution caused by signal delay of the auxiliary capacitance bus line 14 and occurrence of horizontal shadows on the display screen of the liquid crystal display device 1.

In the active matrix substrate 10, the first conductive line branch portion 14a and the second conductive line branch portion 14b of the auxiliary capacitance bus line 14 are disposed along the first source bus line 12a. This structure reduces the parasitic capacitance between the pixel electrode 13 and the first source bus line 12a. Similarly, the third conductive line branch portion 14c and the fourth conductive line branch portion 14d of the auxiliary capacitance bus line 14 are disposed along the second source bus line 12b. This structure reduces the parasitic capacitance between the pixel electrode 13 and the second source bus line 12b. Here, in the state where multiple structure units as shown in FIG. 2 are arranged in the X direction and the Y direction to form a matrix pattern, an auxiliary capacitance bus line is disposed on each side of a source bus line. Accordingly, the active matrix substrate 10 can also reduce occurrence of vertical shadows on the display screen of the liquid crystal display device 1.

The first conductive line branch portion 14a has a length Aa in the X direction longer than a length Ab in the X direction of the second conductive line branch portion 14b. The fourth conductive line branch portion 14d has a length Ad in the X direction longer than a length Ac in the X direction of the third conductive line branch portion 14c. Use of these first conductive line branch portion 14a and fourth conductive line branch portion 14d can efficiently shield a dark line appearance region (part with a low transmittance) at an end of a pixel region from light.

The expression "the length in a certain direction" as used herein means the maximum length in the direction. The pixel region herein means a minimum display unit region, specifically a region defined by a single pixel electrode.

The auxiliary capacitance bus line 14 may be formed from a metal material such as aluminum, copper, titanium, molybdenum, or chromium.

The active matrix substrate 10 further includes, as a switching element, a thin film transistor element 15 connected to the first gate bus line 11a and the first source bus line 12a, i.e., a thin film transistor element 15 that includes a gate electrode connected to the first gate bus line 11a and a source electrode connected to the first source bus line 12a. The active matrix substrate 10 including such a thin film transistor element 15 is also referred to as a thin film transistor array substrate.

A semiconductor layer (channel layer) constituting the thin film transistor element 15 may be formed from a material such as an amorphous silicon, a polysilicon, or an oxide semiconductor. In order to achieve low power consumption and high-speed driving, an oxide semiconductor is preferred. The oxide semiconductor generates a small amount of off-leakage current (current leakage in the off state of the thin film transistor element 15) to achieve low power consumption and generates a large amount of on current (current in the on state of the thin film transistor element 15) to achieve high-speed driving. The oxide semiconductor may be formed from a compound containing indium, gallium, zinc, and oxygen or a compound containing indium, tin, zinc, and oxygen.

The thin film transistor element 15 further includes a drain electrode 16. The drain electrode 16 includes a drain lead-out portion 16p connected to the semiconductor layer (channel layer), and a drain main portion 16m extending from the drain lead-out portion 16p.

The drain main portion 16m is superimposed with the conductive line main portion 14m via an insulating film and is connected to the pixel electrode 13 through a contact hole 17. Specifically, the disposed region of the drain main portion 16m is encompassed by the disposed region of the conductive line main portion 14m. Thereby, an auxiliary capacitance is formed in a pixel region (in FIG. 2, central portion) between the drain main portion 16m and the conductive line main portion 14m.

<Counter Substrate>

The counter substrate 20 may be, for example, a color filter substrate. The color filter substrate may be a product typically used in the field of liquid crystal display devices and may have a structure including, for example, members such as a color filter layer, a black matrix, and a common electrode, on a surface of a transparent substrate such as a glass substrate.

The color filter layer may provide a single color (e.g., red, green, blue) for each pixel region. The black matrix may be disposed in a grid pattern so as to partition the color filter layer. The common electrode may be disposed in a planar form so as to cover the color filter layer and the black matrix. For example, voltage application between the common electrode and the pixel electrode 13 generates a vertical electric field in the liquid crystal layer 30, thereby efficiently controlling the alignment of liquid crystal molecules in the liquid crystal layer 30.

<Liquid Crystal Layer>

The liquid crystal layer 30 may be formed from a positive liquid crystal material having positive anisotropy of dielectric constant or a negative liquid crystal material having negative anisotropy of dielectric constant.

The liquid crystal display device 1 may further include a vertical alignment film on the liquid crystal layer 30 side surface of each of the active matrix substrate 10 and the counter substrate 20. The vertical alignment film may be a film (either of a single layer film and a multilayer film) formed from at least one compound selected from the group consisting of polyimides, polyamic acids, polymaleimides, polyamides, polysiloxanes, polyphosphazenes, polysilsesquioxanes, and copolymers of these, or a film on which a silicon oxide is obliquely vapor deposited. The vertical alignment film may be a vertical photoalignment film containing a photoreactive functional group.

With such a vertical alignment film, liquid crystal molecules in the liquid crystal layer 30 are aligned in the direction perpendicular to the surface of the vertical alignment film in a pixel region, with no voltage applied to the liquid crystal layer 30 (in the case where the voltage applied to the liquid crystal layer 30 is less than the threshold voltage). The expression "liquid crystal molecules are aligned in the direction perpendicular to the surface of the vertical alignment film" as used herein means that the pre-tilt angle of the liquid crystal molecules is 86° to 90°, preferably 87° to 89°, more preferably 87.5° to 89°, with respect to the surface of the vertical alignment film. The pre-tilt angle of a liquid crystal molecule means a tilt angle of the major axis of the liquid crystal molecule with no voltage applied to the liquid crystal layer 30, with respect to the surface of the vertical alignment film.

Figure 3:
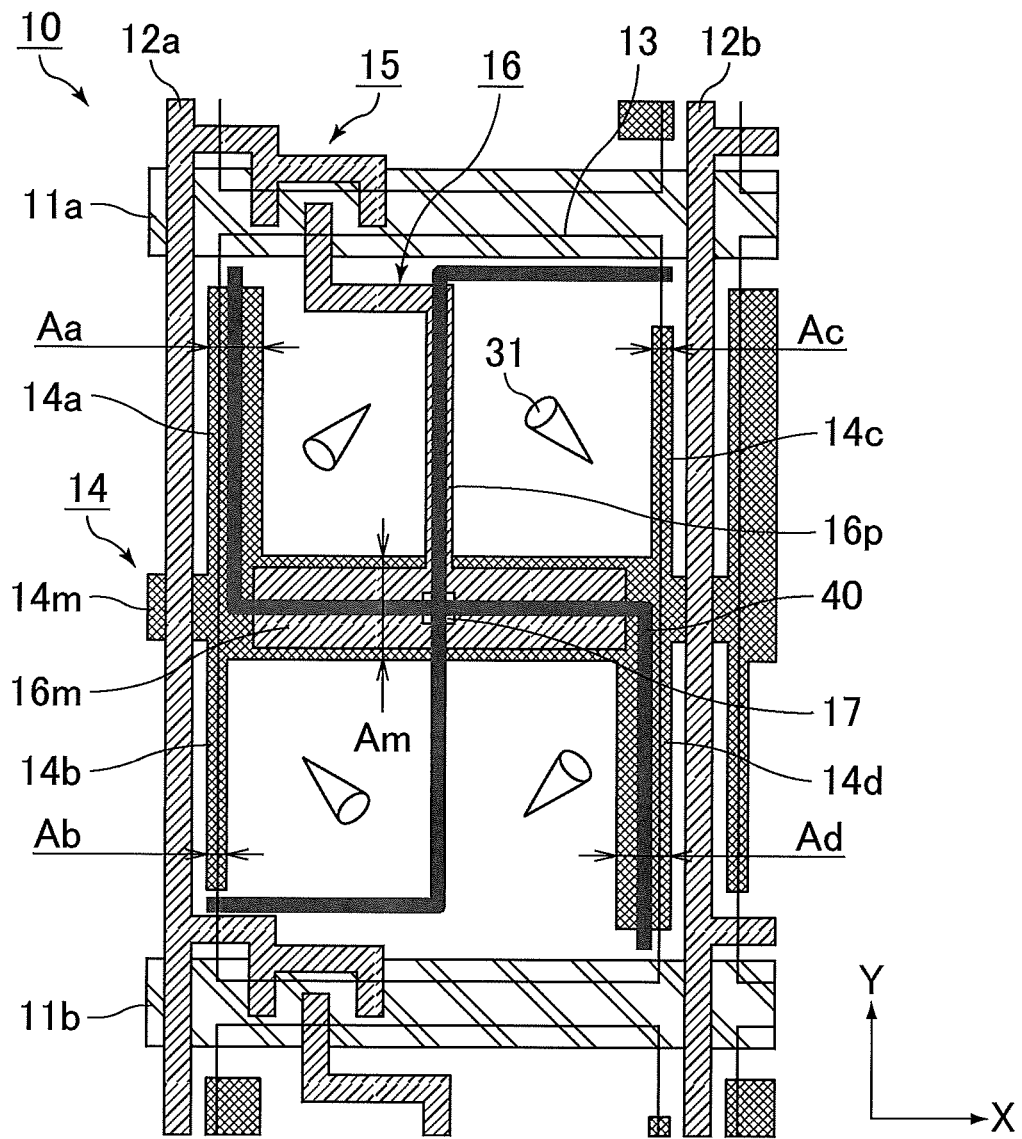
FIG. 3 is a schematic plan view of the liquid crystal display device of Embodiment 1 in an exemplary display state (with voltage applied).

A combination of this vertical alignment film with an alignment division technique allows liquid crystal molecules in the liquid crystal layer 30 with voltage applied to the liquid crystal layer 30 (in the case where the applied voltage to the liquid crystal layer 30 is the threshold voltage or higher) to be aligned divisionally into multiple domains, preferably at least four domains, with different inclination azimuths in a pixel region, resulting in improved viewing angle characteristics. For example, as shown in FIG. 3, liquid crystal molecules 31 may be aligned divisionally into four domains arranged in a matrix pattern including two rows and two columns in a pixel region. FIG. 3 is a schematic plan view of the liquid crystal display device of Embodiment 1 in an exemplary display state (with voltage applied). The inclination azimuth of a liquid crystal molecule as used herein means an orientation (azimuth) of the liquid crystal molecule projected on a surface of a vertical alignment film (alternatively, an active matrix substrate or a counter substrate), and it does not take into consideration the inclination angle (polar angle) with respect to the normal direction on the surface of the vertical alignment film (alternatively, the active matrix substrate or the counter substrate). In FIG. 3, the liquid crystal molecules 31 are shown as cones in order to simply illustrate the inclination azimuths of the liquid crystal molecules 31. The bottom of each cone faces the counter substrate 20 side and the apex of the cone faces the active matrix substrate 10 side.

When the X direction in FIG. 3 is defined as 0° and the azimuth is defined to be positive in the counterclockwise direction, the four domains preferably consist of a domain including liquid crystal molecules 31 having an inclination azimuth of about 45°, a domain including liquid crystal molecules 31 having an inclination azimuth of about 135°, a domain including liquid crystal molecules 31 having an inclination azimuth of about 225°, and a domain including liquid crystal molecules 31 having an inclination azimuth of about 315°. This structure can improve the viewing angle characteristics and efficiently enhance the transmittance. The expression a liquid crystal molecule 31 has an inclination azimuth of about 45°, about 135°, about 225°, and about 315°, herein means 43° to 47°, 133° to 137°, 223° to 227°, and 313° to 317°, respectively, and preferably means 44° to 46°, 134° to 136°, 224° to 226°, and 314° to 316°, respectively.

As shown in FIG. 3, when the liquid crystal molecules 31 with voltage applied to the liquid crystal layer 30 are aligned divisionally into four domains in the pixel region, dark lines 40 appear at ends of the pixel region and at the boundaries between the four domains. In Embodiment 1, the appearance regions of the dark lines 40 at the ends of the pixel region (in the Y direction) can be efficiently shielded from light by use of the first conductive line branch portion 14a and the fourth conductive line branch portion 14d of the auxiliary capacitance bus line 14. As a result, this can improve the display quality such as a level of afterimage (image sticking) and response speed even when the liquid crystal display device is designed to have high definition.

In order to efficiently shield the appearance regions of the dark lines 40 (length in the X direction: about 3 µm, for example) from light and ensure the aperture ratio, the length Aa in the X direction of the first conductive line branch portion 14a and the length Ad in the X direction of the fourth conductive line branch portion 14d are each preferably 3 to 8 µm. The length Aa in the X direction of the first conductive line branch portion 14a and the length Ad in the X direction of the fourth conductive line branch portion 14d may be the same as or different from each other. Similarly, the length Ab in the X direction of the second conductive line branch portion 14b and the length Ac in the X direction of the third conductive line branch portion 14c are each preferably 3 to 5 µm. The length Ab in the X direction of the second conductive line branch portion 14b and the length Ac in the X direction of the third conductive line branch portion 14c may be the same as or different from each other.

The conductive line main portion 14m of the auxiliary capacitance bus line 14 is, as shown in FIG. 3, sufficiently thick in the Y direction. Thus, the appearance regions of the dark lines 40 at the boundaries between the four domains (in the X direction) are also efficiently shielded from light. The length Am in the Y direction of the conductive line main portion 14m is preferably 3 to 8 µm.

The liquid crystal display device 1 may further include a polarizing plate on each of the active matrix substrate 10 and the counter substrate 20 on the side remote from the liquid crystal layer 30, and may further include a backlight on the active matrix substrate 10 side polarizing plate on the side remote from the liquid crystal layer 30. In this case, the liquid crystal display device 1 operates as a transmissive liquid crystal display device.

The liquid crystal display device 1 may further include, in addition to the aforementioned members, members typically used in the field of liquid crystal display devices, such as external circuits, including a tape carrier package (TCP) and a print circuit board (PCB); and a bezel (frame).

Embodiment 2

A liquid crystal display device of Embodiment 2 has the same structure as in Embodiment 1 except for the disposed region of the drain electrode in the active matrix substrate, and thus the description of the same respects is omitted here.

Figure 4:
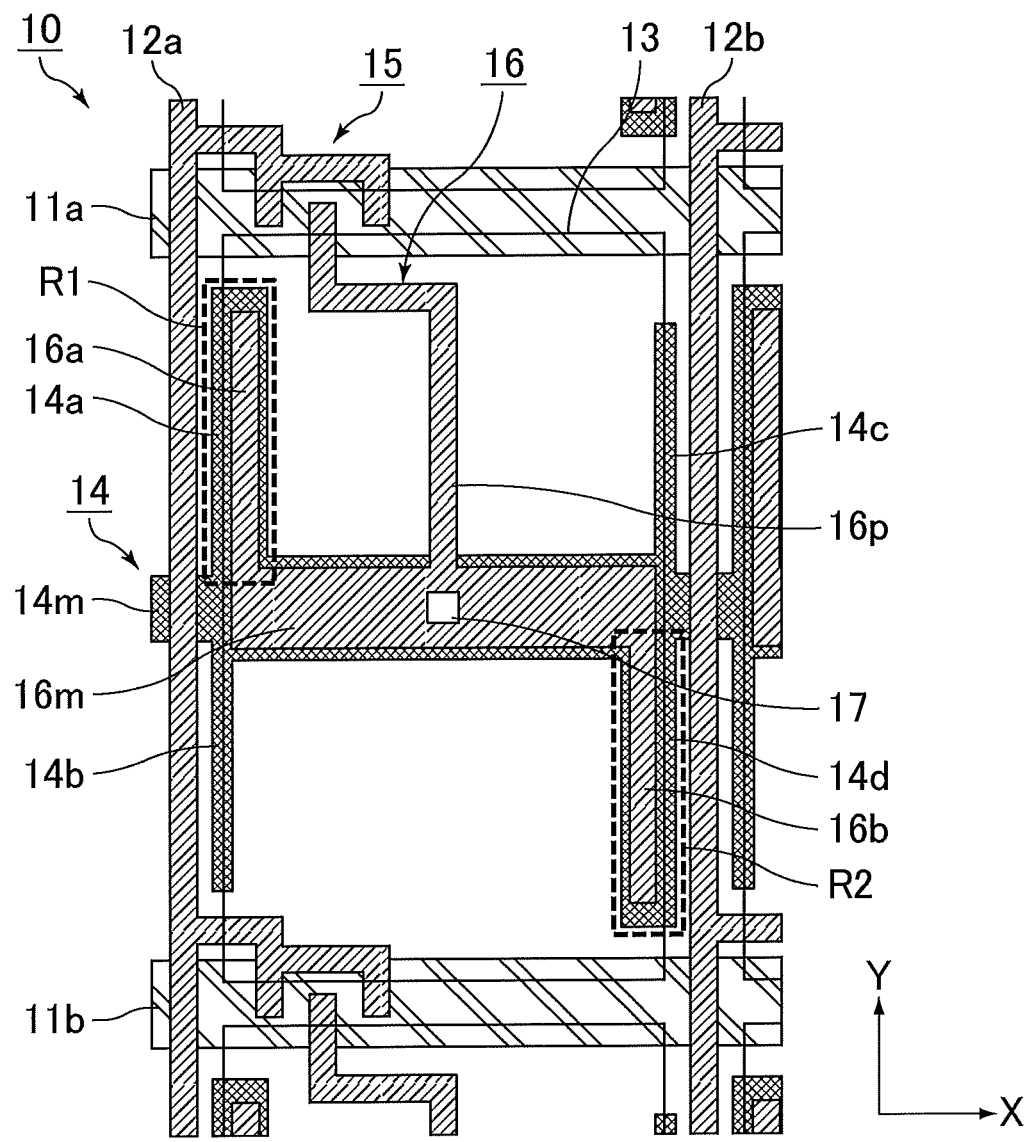
FIG. 4 is a schematic plan view of a part of an active matrix substrate of Embodiment 2.

FIG. 4 is a schematic plan view of a part of an active matrix substrate of Embodiment 2. As shown in FIG. 4, the drain electrode 16 includes, in addition to the drain lead-out portion 16p and the drain main portion 16m, a first drain branch portion 16a and a second drain branch portion 16b. The first drain branch portion 16a and the second drain branch portion 16b each branch from the drain main portion 16m.

The first drain branch portion 16a is superimposed with the first conductive line branch portion 14a via the insulating film. Specifically, the disposed region of the first drain branch portion 16a is encompassed by the disposed region of the first conductive line branch portion 14a. This structure enables formation of an auxiliary capacitance between the first drain branch portion 16a and the first conductive line branch portion 14a in a region R1 at an end of a pixel region.

The second drain branch portion 16b is superimposed with the fourth conductive line branch portion 14d via the insulating film. Specifically, the disposed region of the second drain branch portion 16b is encompassed by the disposed region of the fourth conductive line branch portion 14d. This structure enables formation of an auxiliary capacitance between the second drain branch portion 16b and the fourth conductive line branch portion 14d in a region R2 at an end of a pixel region.

In Embodiment 2, the first conductive line branch portion 14a and the fourth conductive line branch portion 14d, which are enlarged in order to shield the appearance regions of dark lines from light, can also be used for formation of an auxiliary capacitance. Accordingly, in Embodiment 2, the auxiliary capacitance in the Y direction is more increased than in Embodiment 1, thereby contributing to more improved display quality.

Embodiment 3

A liquid crystal display device of Embodiment 3 has the same structure as in Embodiment 2 except for the disposed regions of the auxiliary capacitance bus line and the drain electrode in the active matrix substrate, and thus the description of the same respects is omitted here.

Figure 5:
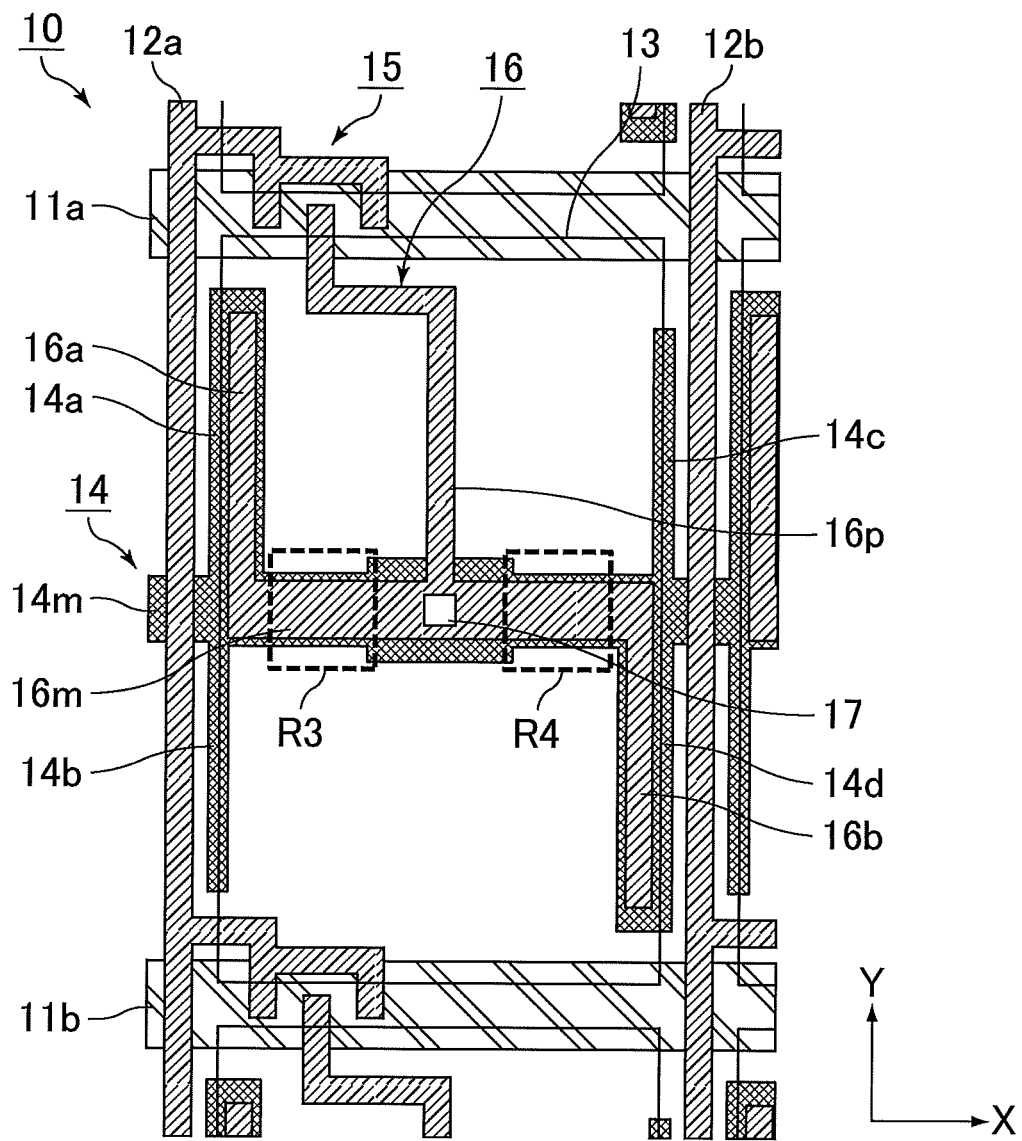
FIG. 5 is a schematic plan view of a part of an active matrix substrate of Embodiment 3.

In Embodiment 2, the auxiliary capacitance in the Y direction is increased in the regions R1 and R2 in FIG. 4. Accordingly, as shown in FIG. 5, the auxiliary capacitance in the Y direction may be reduced in other regions to enhance the transmittance. FIG. 5 is a schematic plan view of a part of an active matrix substrate of Embodiment 3.

As shown in regions R3 and R4 in FIG. 5, the length in the Y direction of the conductive line main portion 14m and the length in the Y direction of the drain main portion 16m are shorter than those in FIG. 4. Therefore, in Embodiment 3, the auxiliary capacitance in the Y direction is reduced in the regions R3 and R4 but the transmittance is increased, as compared with the case in Embodiment 2.

Embodiment 4

A liquid crystal display device of Embodiment 4 has the same structure as in Embodiment 3 except for the positional relationship between the auxiliary capacitance bus line and the drain electrode in the active matrix substrate, and thus the description of the same respects is omitted here.

Figure 6:
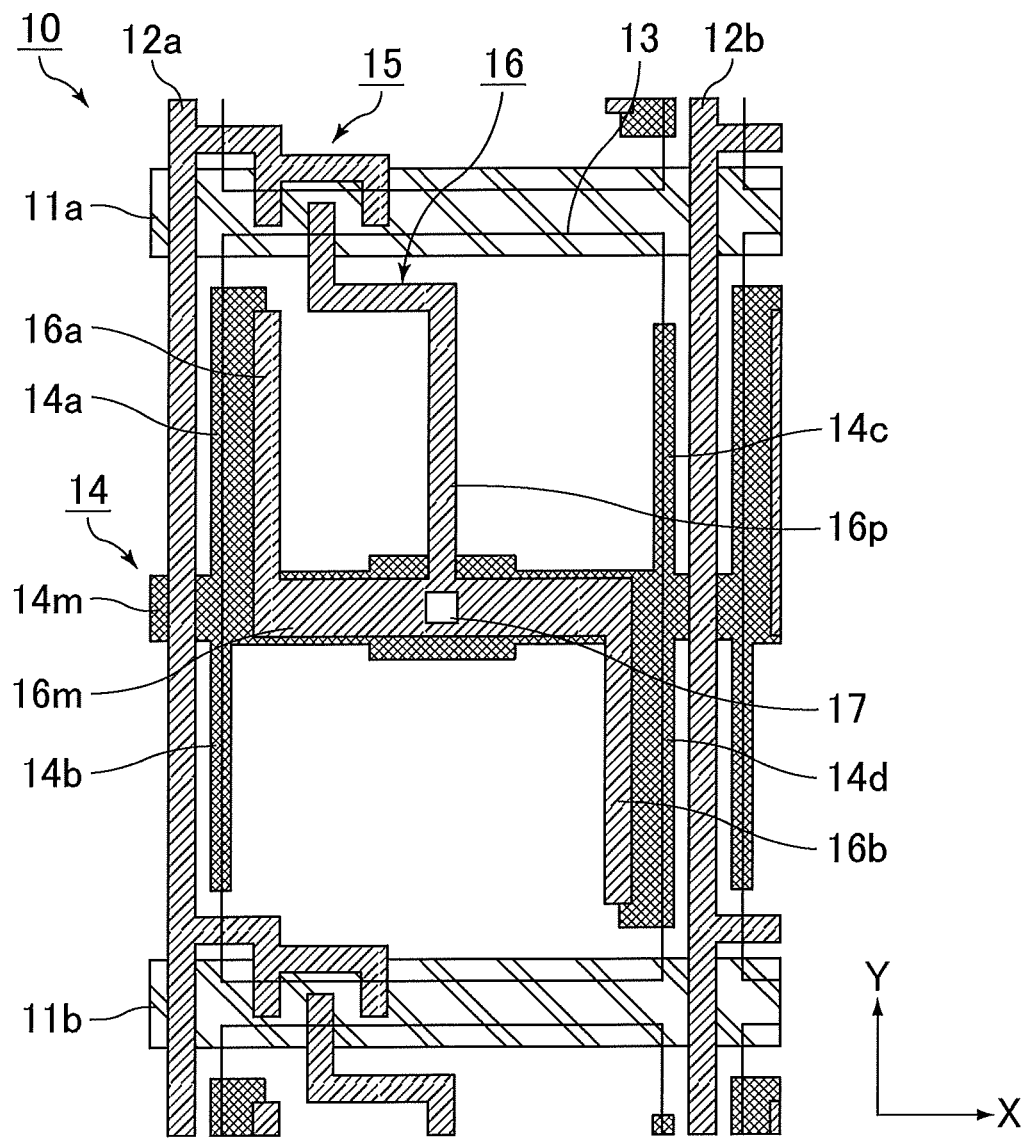
FIG. 6 is a schematic plan view of a part of an active matrix substrate of Embodiment 4.

FIG. 6 is a schematic plan view of a part of an active matrix substrate of Embodiment 4. As shown in FIG. 6, the disposed region of the first drain branch portion 16a is partly shifted (in FIG. 6, to the right) from the disposed region of the first conductive line branch portion 14a. Similarly, the disposed region of the second drain branch portion 16b is partly shifted (in FIG. 6, to the left) from the disposed region of the fourth conductive line branch portion 14d. In this case, even when the first drain branch portion 16a (second drain branch portion 16b) has an undesirable size, for example, the superimposing state between the first drain branch portion 16a (second drain branch portion 16b) and the first conductive line branch portion 14a (fourth conductive line branch portion 14d) is less likely to change, which resultantly achieves less change in auxiliary capacitance. In contrast, in the case where the disposed region of the first drain branch portion 16a (second drain branch portion 16b) is encompassed by the disposed region of the first conductive line branch portion 14a (fourth conductive line branch portion 14d) (e.g., Embodiment 2), for example, and the first drain branch portion 16a (second drain branch portion 16b) has an undesirable size, the superimposing state between the first drain branch portion 16a (second drain branch portion 16b) and the first conductive line branch portion 14a (fourth conductive line branch portion 14d) changes, which resultantly causes more change in auxiliary capacitance than in Embodiment 4.

Embodiment 5

A liquid crystal display device of Embodiment 5 has the same structure as in Embodiment 4 except for the positional relationship between the auxiliary capacitance bus line and the drain electrode in the active matrix substrate, and thus the description of the same respects is omitted here.

Figure 7:
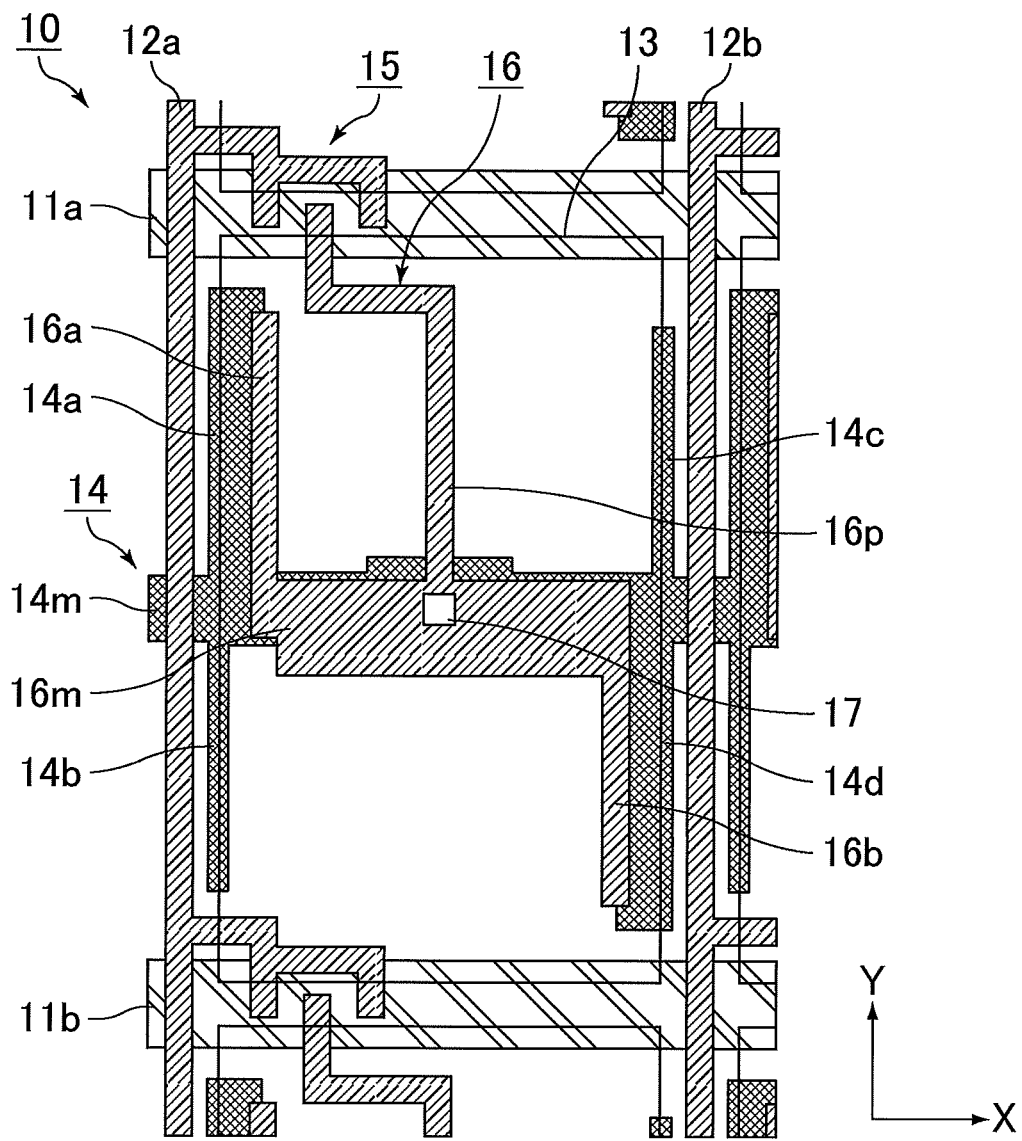
FIG. 7 is a schematic plan view of a part of an active matrix substrate of Embodiment 5.

FIG. 7 is a schematic plan view of a part of an active matrix substrate of Embodiment 5. As shown in FIG. 7, the disposed region of the drain main portion 16m is partly shifted (in FIG. 7, to the bottom) from the disposed region of the conductive line main portion 14m. In this case, even when the drain main portion 16m has an undesirable size, for example, the superimposing state between the drain main portion 16m and the conductive line main portion 14m is less likely to change, which resultantly achieves less change in auxiliary capacitance. In contrast, in the case where the disposed region of the drain main portion 16m is encompassed by the disposed region of the conductive line main portion 14m (e.g., Embodiment 2), for example, and the drain main portion 16m has an undesirable size, the superimposing state between the drain main portion 16m and the conductive line main portion 14m changes, which resultantly causes more change in auxiliary capacitance than in Embodiment 5.

Embodiment 6

A liquid crystal display device of Embodiment 6 has the same structure as in Embodiment 2 except for the disposed region of the drain electrode in the active matrix substrate, and thus the description of the same respects is omitted here.

Figure 8:
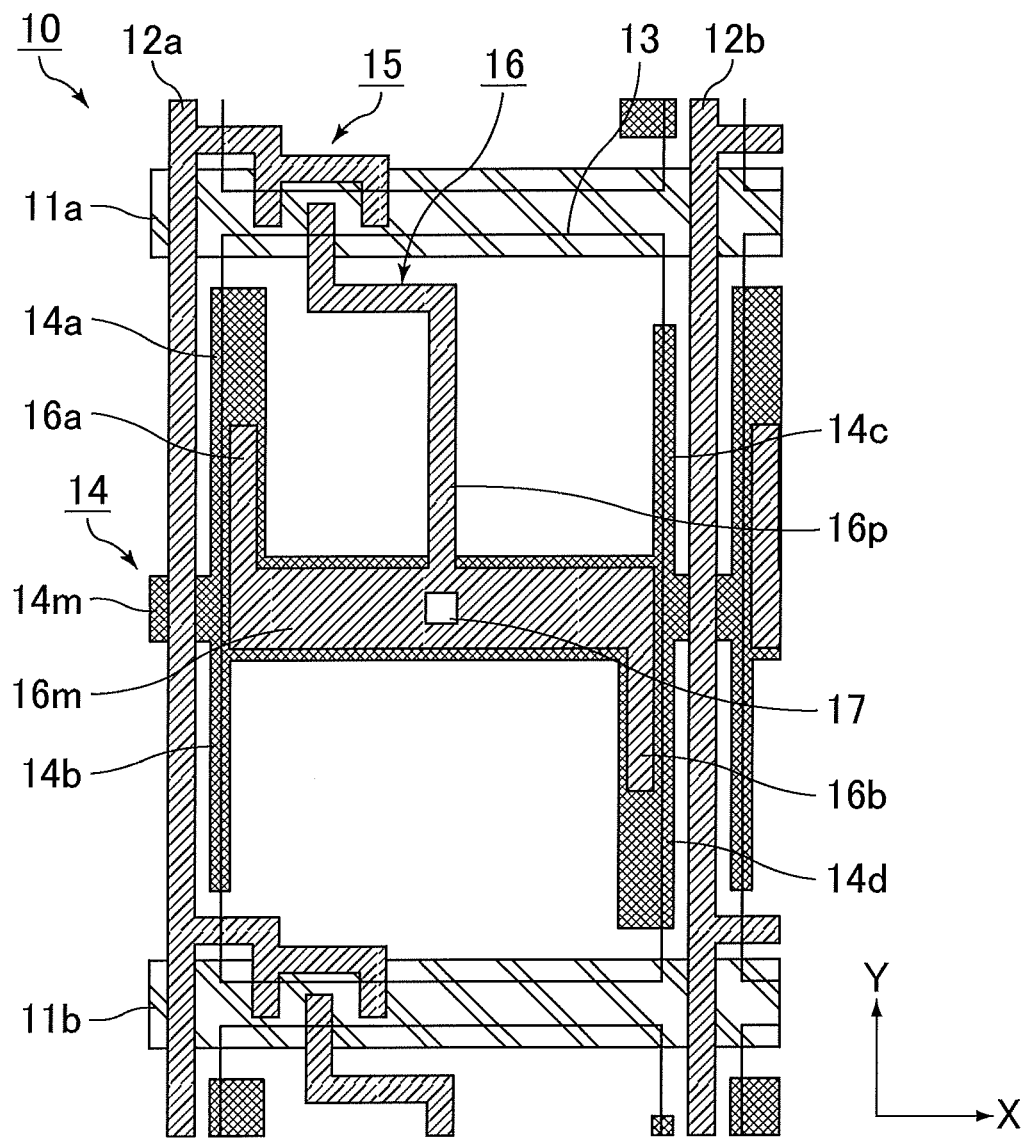
FIG. 8 is a schematic plan view of a part of an active matrix substrate of Embodiment 6.

In Embodiment 2, the display quality is further improved by an increase in auxiliary capacitance. This embodiment may have a structure as shown in FIG. 8 to increase the charging rate of the auxiliary capacitance while ensuring the display quality. FIG. 8 is a schematic plan view of a part of an active matrix substrate of Embodiment 6.

As shown in FIG. 8, the length in the Y direction of the first drain branch portion 16a is shorter than in FIG. 4. This structure increases the charging rate of the auxiliary capacitance although reducing the auxiliary capacitance between the first drain branch portion 16a and the first conductive line branch portion 14a as compared with the case in FIG. 4. Similarly, the length in the Y direction of the second drain branch portion 16b is shorter than in FIG. 4. This structure increases the charging rate of the auxiliary capacitance although reducing the auxiliary capacitance between the second drain branch portion 16b and the fourth conductive line branch portion 14d as compared with the case in FIG. 4. Furthermore, the shorter lengths in the Y direction of the first drain branch portion 16a and the second drain branch portion 16b reduce the leak probability between the first source bus line 12a and the first drain branch portion 16a and the leak probability between the second source bus line 12b and the second drain branch portion 16b. Accordingly, in Embodiment 6, the charging rate of the auxiliary capacitance can be increased while the display quality is ensured.

Embodiment 7

A liquid crystal display device of Embodiment 7 has the same structure as in Embodiment 1 except for the disposed regions of the auxiliary capacitance bus line and the drain electrode in the active matrix substrate, and thus the description of the same respects is omitted here.

Figure 9:
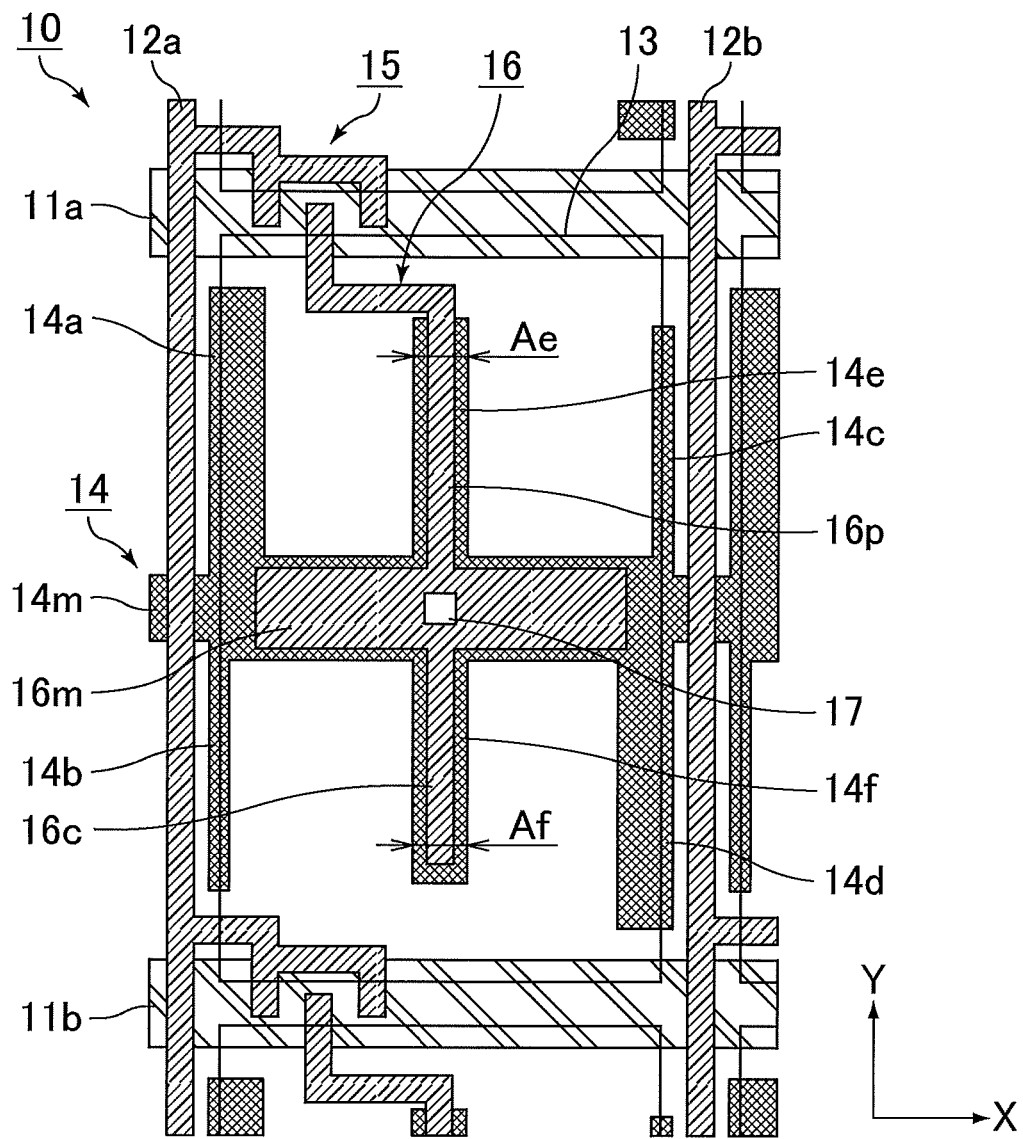
FIG. 9 is a schematic plan view of a part of an active matrix substrate of Embodiment 7.

In Embodiments 1 to 6, as shown in FIG. 3, the appearance regions of the dark lines 40 at ends of a pixel region can be efficiently shielded from light. The area for light shielding may be enlarged in other appearance regions, especially at the boundaries between the four domains, as shown in FIG. 9. FIG. 9 is a schematic plan view of a part of an active matrix substrate of Embodiment 7.

As shown in FIG. 9, the auxiliary capacitance bus line 14 includes, in addition to the conductive line main portion 14m, the first conductive line branch portion 14a, the second conductive line branch portion 14b, the third conductive line branch portion 14c, and the fourth conductive line branch portion 14d, a fifth conductive line branch portion 14e and a sixth conductive line branch portion 14f. The fifth conductive line branch portion 14e and the sixth conductive line branch portion 14f each branch from the conductive line main portion 14m.

The fifth conductive line branch portion 14e extends in the Y direction between the first conductive line branch portion 14a and the third conductive line branch portion 14c. The fifth conductive line branch portion 14e is superimposed with a boundary (in the Y direction) between the four domains as shown in FIG. 3.

The sixth conductive line branch portion 14f extends in the direction opposite to the fifth conductive line branch portion 14e between the second conductive line branch portion 14b and the fourth conductive line branch portion 14d. The sixth conductive line branch portion 14f is superimposed with a boundary (in the Y direction) between the four domains as shown in FIG. 3.

In Embodiment 7, use of the fifth conductive line branch portion 14e and the sixth conductive line branch portion 14f can efficiently shield the appearance regions of the dark lines 40 from light at the boundaries (in the Y direction) between the four domains. As a result, in Embodiment 7, the area for shielding the dark lines 40 from light is increased as compared with the cases in Embodiments 1 to 6, which resultantly more enhances the display quality.

In order to efficiently shield the appearance regions of the dark lines 40 (length in the X direction: about 3 μm, for example) from light and ensure the aperture ratio, the length Ae in the X direction of the fifth conductive line branch portion 14e and the length Af in the X direction of the sixth conductive line branch portion 14f are each preferably 5 to 11 μm. The length Ae in the X direction of the fifth conductive line branch portion 14e and the length Af in the X direction of the sixth conductive line branch portion 14f may be the same as or different from each other.

In Embodiment 7, the fifth conductive line branch portion 14e and the sixth conductive line branch portion 14f, which are additionally disposed to shield the appearance regions of the dark lines 40 from light, can also be used for formation of an auxiliary capacitance. Specifically, as shown in FIG. 9, the structure in which the fifth conductive line branch portion 14e is superimposed with the drain lead-out portion 16p via the insulating film enables formation of an auxiliary capacitance between the fifth conductive line branch portion 14e and the drain lead-out portion 16p. Similarly, the structure in which a third drain branch portion 16c, which branches from the drain main portion 16m and extends in the direction opposite to the drain lead-out portion 16p, is superimposed with the sixth conductive line branch portion 14f via the insulating film enables formation of an auxiliary capacitance between the sixth conductive line branch portion 14f and the third drain branch portion 16c.

Figure 10:
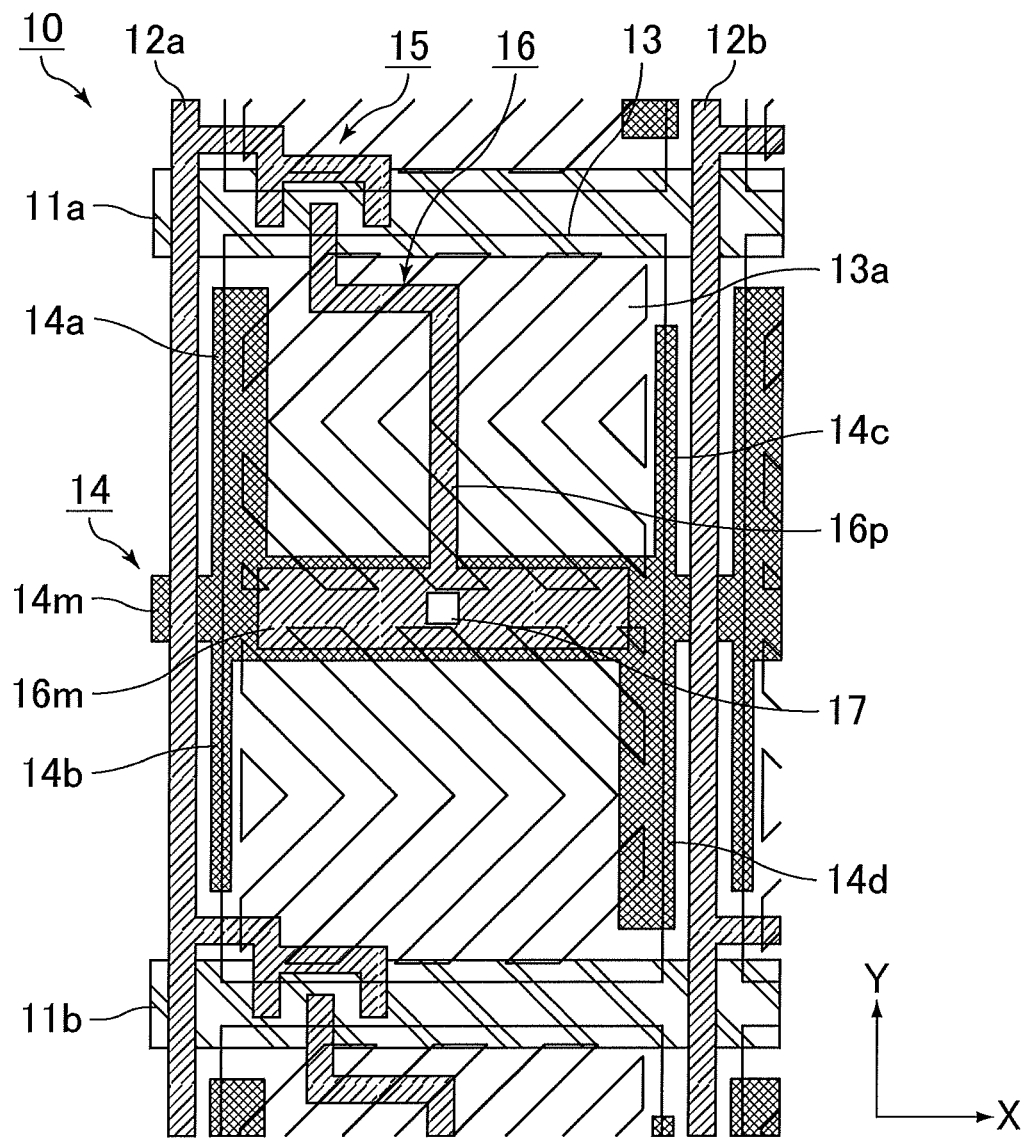
FIG. 10 is a schematic plan view of a part of an active matrix substrate of a modified example of Embodiment 1.

In Embodiments 1 to 7, a case is given where the liquid crystal molecules 31 with voltage applied to the liquid crystal layer 30 are aligned divisionally into four domains in a pixel region, as shown in FIG. 3. The liquid crystal molecules 31 may be aligned divisionally into eight domains (four rows and two columns) as shown in FIG. 10 using an active matrix substrate 10 in which the pixel electrode 13 is provided with slits 13a. FIG. 10 is a schematic plan view of a part of an active matrix substrate of a modified example of Embodiment 1. The structure as shown in FIG. 10 is the same as that in FIG. 2 except that the pixel electrode 13 is provided with the slits 13a.

Figure 11:
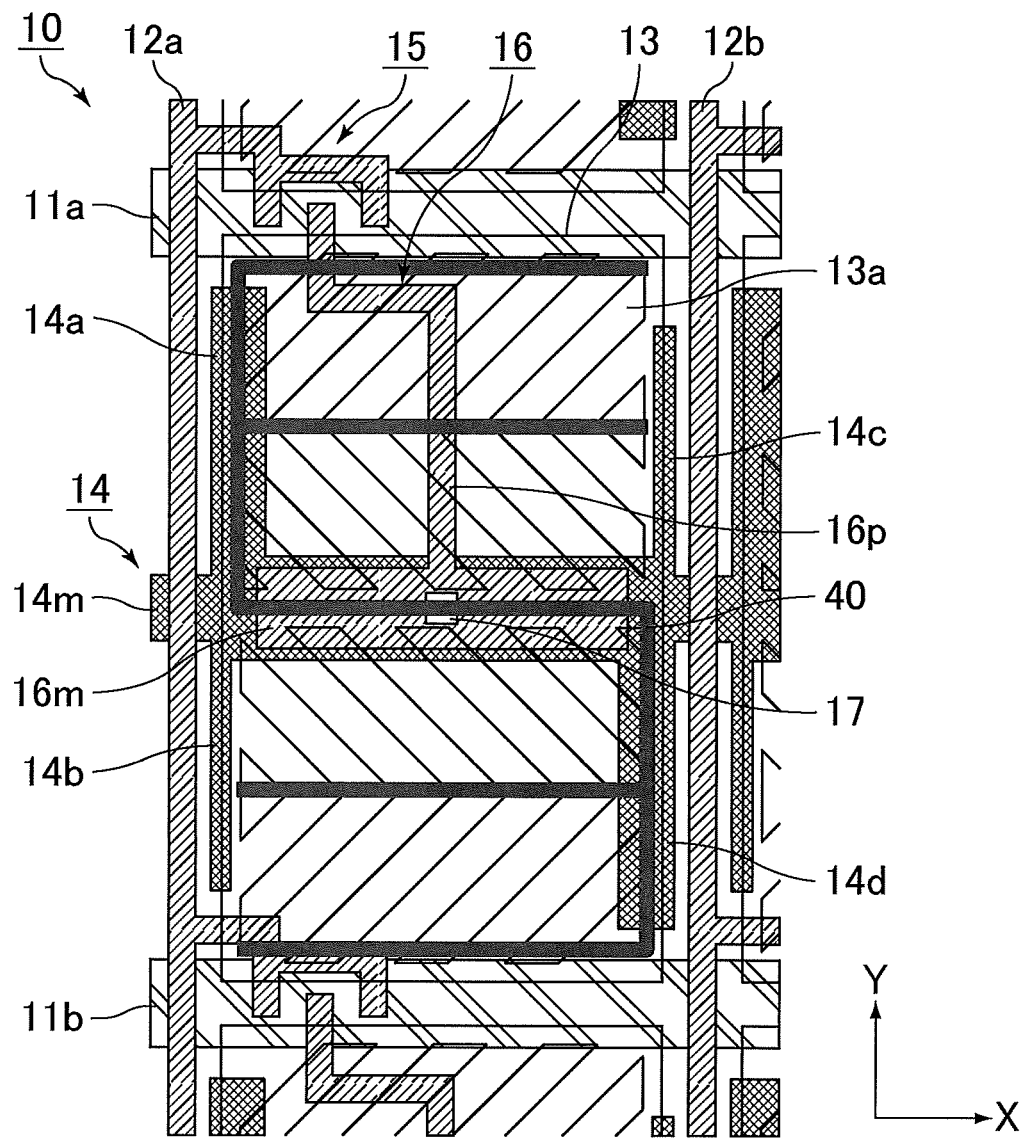
FIG. 11 is a schematic plan view of the liquid crystal display device of the modified example of Embodiment 1 in an exemplary display state (with voltage applied).

When the active matrix substrate 10 as shown in FIG. 10 is employed, dark lines 40 as shown in FIG. 11 appear with voltage applied to the liquid crystal layer 30. FIG. 11 is a schematic plan view of the liquid crystal display device of the modified example of Embodiment 1 in an exemplary display state (with voltage applied). Also in this case, use of the first conductive line branch portion 14a and the fourth conductive line branch portion 14d of the auxiliary capacitance bus line 14 can efficiently shield the appearance regions of the dark lines 40 at ends (in the Y direction) of the pixel region from light. In the present modified example, a case is given where the pixel electrode 13 in Embodiment 1 is modified (is provided with the slits 13a). A similar modification may be applied to Embodiments 2 to 7.

In Embodiments 1 to 7, a case is given where the length Aa in the X direction of the first conductive line branch portion 14a is longer than the length Ab in the X direction of the second conductive line branch portion 14b and the length Ad in the X direction of the fourth conductive line branch portion 14d is longer than the length Ac in the X direction of the third conductive line branch portion 14c. The following cases (1) to (3) are also allowable.

(1) The length Aa in the X direction of the first conductive line branch portion 14a is longer than the length Ab in the X direction of the second conductive line branch portion 14b and the length Ac in the X direction of the third conductive line branch portion 14c is longer than the length Ad in the X direction of the fourth conductive line branch portion 14d.

(2) The length Ab in the X direction of the second conductive line branch portion 14b is longer than the length Aa in the X direction of the first conductive line branch portion 14a and the length Ad in the X direction of the fourth conductive line branch portion 14d is longer than the length Ac in the X direction of the third conductive line branch portion 14c.

(3) The length Ab in the X direction of the second conductive line branch portion 14b is longer than the length Aa in the X direction of the first conductive line branch portion 14a and the length Ac in the X direction of the third conductive line branch portion 14c is longer than the length Ad in the X direction of the fourth conductive line branch portion 14d.

Figure 12:
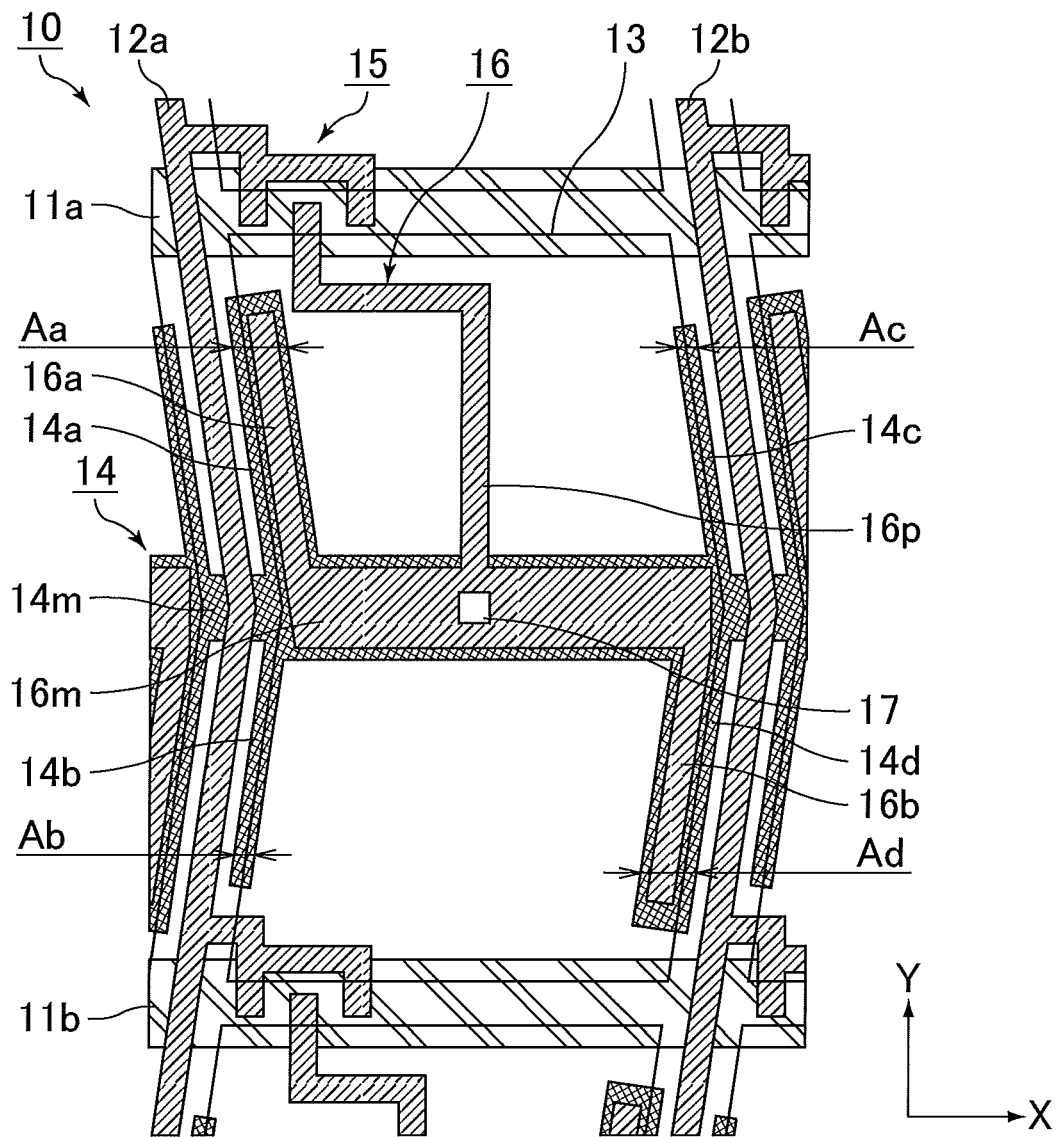
FIG. 12 is a schematic plan view of a part of an active matrix substrate of a first modified example of Embodiment 2.

In Embodiments 1 to 7, a case is given where the pixel region (pixel electrode 13) has a rectangular shape in a plan view. The pixel region may have a shape other than a rectangular shape, as shown in FIG. 12. FIG. 12 is a schematic plan view of a part of an active matrix substrate of a first modified example of Embodiment 2. The structure in FIG. 12 is the same as that in FIG. 4 except for the shape of the pixel region. In the present modified example, a case is given where the shape of the pixel region in Embodiment 2 is modified. A similar modification may be applied to Embodiments 1 and 3 to 7.

In Embodiments 1 to 7 (and modified examples thereof), an alignment mode is exemplified where a combination of a vertical alignment film and an alignment division technique is used for the active matrix substrate 10 to allow the liquid crystal molecules 31 to be aligned divisionally into multiple domains. Alternatively, an active matrix substrate 10 including a pixel electrode 13 provided with cutouts may be employed in combination with a horizontal alignment film to achieve an in-plane switching (IPS) mode liquid crystal display device. Similarly in the IPS mode liquid crystal display device, a pixel region may have a part with a low transmittance at an end thereof (especially, an end along a source bus line). Thus, the display quality can be improved by use of any active matrix substrate of the aforementioned cases (1) to (3) as well as of Embodiments 1 to 7 (and modified examples thereof).

Figure 13:
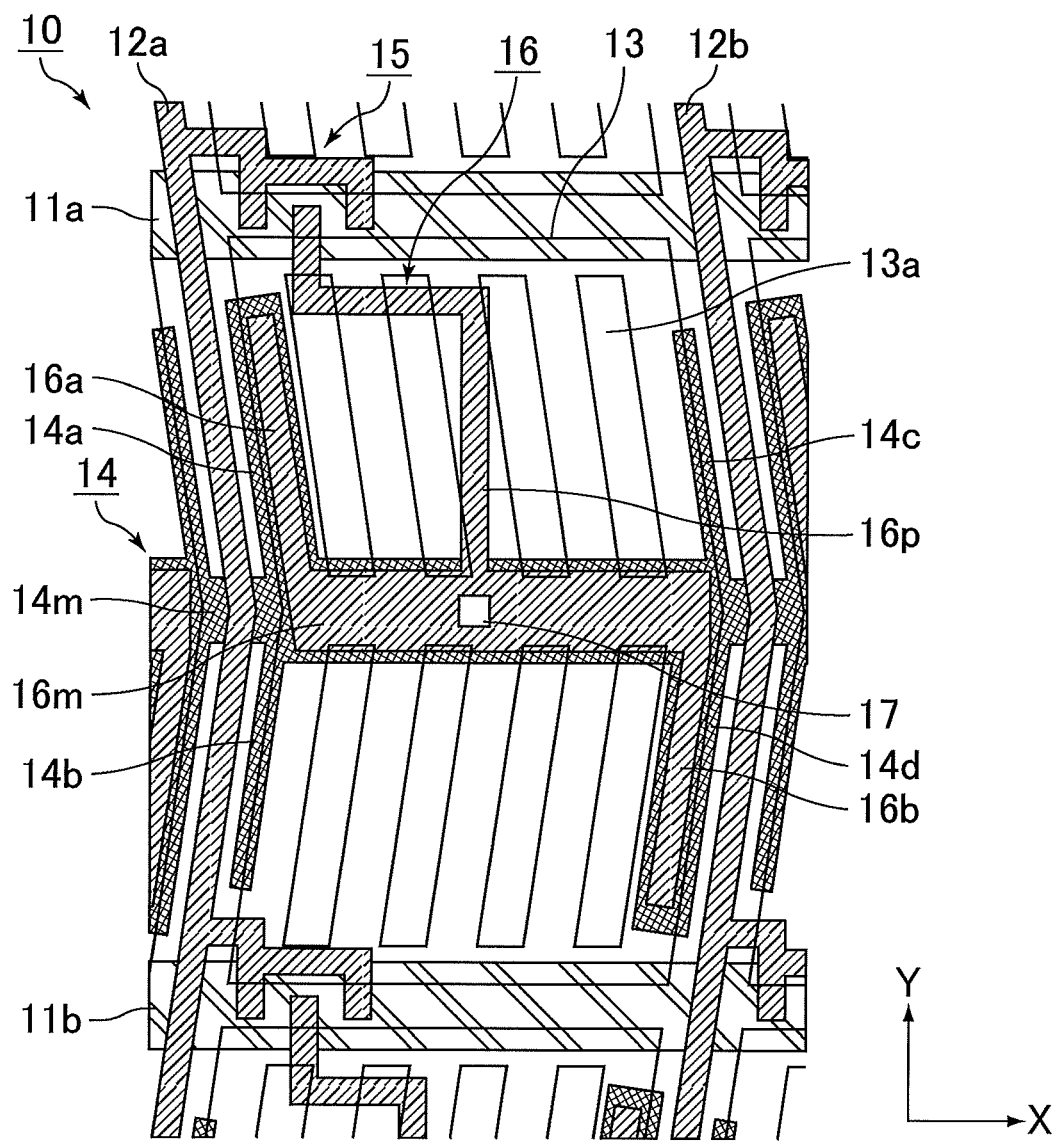
FIG. 13 is a schematic plan view of a part of an active matrix substrate of a second modified example of Embodiment 2.

In the IPS mode liquid crystal display device in which, for example, the pixel region (pixel electrode 13) has a shape other than a rectangular shape in a plan view, the pixel electrode 13 is provided with slits 13a as shown in FIG. 13. FIG. 13 is a schematic plan view of a part of an active matrix substrate of a second modified example of Embodiment 2. The structure in FIG. 13 is the same as in FIG. 4 except that the shape of the pixel region is changed and the pixel electrode 13 is provided with the slits 13a. The slits 13a may be disposed with different angles and/or widths from those in FIG. 13. The slits 13a may have a different shape from those in FIG. 13, such as a shape in which the slits connect to each other (are not separated) in a region superimposed with the conductive line main portion 14m of the auxiliary capacitance bus line 14, or a shape with bending end(s). In the present modified example, a case is given where the shape of the pixel region is changed and the pixel electrode 13 is provided with the slits 13a in Embodiment 2. A similar modification may be applied to Embodiments 1 and 3 to 7.

[Additional Remarks]

A first aspect of the present invention may be an active matrix substrate including: a first gate bus line and a second gate bus line each extending in a first direction; a first source bus line and a second source bus line each extending in a second direction intersecting the first direction; a pixel electrode disposed in a region partitioned by the first gate bus line, the second gate bus line, the first source bus line, and the second source bus line; and an auxiliary capacitance bus line including a conductive line main portion and conductive line branch portions branching from the conductive line main portion, the conductive line main portion extending in the first direction to intersect the first source bus line and the second source bus line, the conductive line branch portions including a first conductive line branch portion superimposed with a first end of the pixel electrode and extending in the second direction along the first source bus line, a second conductive line branch portion superimposed with the first end of the pixel electrode and extending in a direction opposite to the first conductive line branch portion, a third conductive line branch portion superimposed with a second end of the pixel electrode and extending in the second direction along the second source bus line, and a fourth conductive line branch portion superimposed with the second end of the pixel electrode and extending in a direction opposite to the third conductive line branch portion, one of the first conductive line branch portion and the second conductive line branch portion having a longer length in the first direction than the other conductive line branch portion, one of the third conductive line branch portion and the fourth conductive line branch portion having a longer length in the first direction than the other conductive line branch portion. This aspect can achieve an active matrix substrate capable of improving the display quality.

In the first aspect of the present invention, the first conductive line branch portion may have a longer length in the first direction than the second conductive line branch portion, and the fourth conductive line branch portion may have a longer length in the first direction than the third conductive line branch portion. This enables efficient shielding of a part with a low transmittance (dark line) at an end of the pixel region from light with use of the first conductive line branch portion and the fourth conductive line branch portion.

In the first aspect of the present invention, the active matrix substrate may further include a thin film transistor element connected to the first gate bus line and the first source bus line, and the thin film transistor element may include a drain electrode that includes a drain main portion superimposed with the conductive line main portion, a first drain branch portion branching from the drain main portion and superimposed with the first conductive line branch portion, and a second drain branch portion branching from the drain main portion and superimposed with the fourth conductive line branch portion. This enables formation of an auxiliary capacitance between the drain main portion and the conductive line main portion, between the first drain branch portion and the first conductive line branch portion, and between the second drain branch portion and the fourth conductive line branch portion.

In the first aspect of the present invention, a disposed region of the drain main portion may be encompassed by a disposed region of the conductive line main portion, a disposed region of the first drain branch portion may be encompassed by a disposed region of the first conductive line branch portion, and a disposed region of the second drain branch portion may be encompassed by a disposed region of the fourth conductive line branch portion. This enables efficient formation of an auxiliary capacitance between the drain main portion and the conductive line main portion, between the first drain branch portion and the first conductive line branch portion, and between the second drain branch portion and the fourth conductive line branch portion.

In the first aspect of the present invention, a disposed region of the first drain branch portion may be partly shifted from a disposed region of the first conductive line branch portion, and a disposed region of the second drain branch portion may be partly shifted from a disposed region of the fourth conductive line branch portion. Thereby, even when the first drain branch portion has an undesirable size, for example, the superimposing state between the first drain branch portion (second drain branch portion) and the first conductive line branch portion (fourth conductive line branch portion) is less likely to change, which resultantly achieves less change in auxiliary capacitance.

In the first aspect of the present invention, a disposed region of the drain main portion may be partly shifted from a disposed region of the conductive line main portion. Thereby, even when the drain main portion has an undesirable size, for example, the superimposing state between the drain main portion and the conductive line main portion is less likely to change, which resultantly achieves less change in auxiliary capacitance.

A second aspect of the present invention may be a liquid crystal display device including: the active matrix substrate; a counter substrate facing the active matrix substrate; and a liquid crystal layer held between the active matrix substrate and the counter substrate. This aspect achieves a liquid crystal display device with a high display quality.

In the second aspect of the present invention, liquid crystal molecules in the liquid crystal layer with voltage applied to the liquid crystal layer may be aligned divisionally into at least four domains with different inclination azimuths in a pixel region defined by the pixel electrode. This improves the viewing angle characteristics.

In the second aspect of the present invention, the conductive line branch portions may further include a fifth conductive line branch portion extending in the second direction between the first conductive line branch portion and the third conductive line branch portion and a sixth conductive line branch portion extending in an opposite direction to the fifth conductive line branch portion between the second conductive line branch portion and the fourth conductive line branch portion, and the fifth conductive line branch portion and the sixth conductive line branch portion may each be superimposed with a boundary between the at least four domains. This enables efficient shielding of the appearance regions of dark lines from light at the boundaries between the at least four domains with use of the fifth conductive line branch portion and the sixth conductive line branch portion.

What is claimed is:

1. An active matrix substrate comprising:
   a first gate bus line and a second gate bus line each extending in a first direction;
   a first source bus line and a second source bus line each extending in a second direction intersecting the first direction;
   a pixel electrode disposed in a region partitioned by the first gate bus line, the second gate bus line, the first source bus line, and the second source bus line; and
   an auxiliary capacitance bus line including a conductive line main portion and conductive line branch portions branching from the conductive line main portion,
   the conductive line main portion extending in the first direction to intersect the first source bus line and the second source bus line,
   the conductive line branch portions including a first conductive line branch portion superimposed with a first end of the pixel electrode and extending in the second direction along the first source bus line, a second conductive line branch portion superimposed with the first end of the pixel electrode and extending in a direction opposite to the first conductive line branch portion, a third conductive line branch portion superimposed with a second end of the pixel electrode and extending in the second direction along the second source bus line, and a fourth conductive line branch portion superimposed with the second end of the pixel electrode and extending in a direction opposite to the third conductive line branch portion,
one of the first conductive line branch portion and the second conductive line branch portion having a longer length in the first direction than the other conductive line branch portion,
one of the third conductive line branch portion and the fourth conductive line branch portion having a longer length in the first direction than the other conductive line branch portion, wherein:
the first conductive line branch portion has a longer length in the first direction than the second conductive line branch portion,
the fourth conductive line branch portion has a longer length in the first direction than the third conductive line branch portion,
the active matrix substrate further comprises a thin film transistor element connected to the first gate bus line and the first source bus line,
the thin film transistor element includes a drain electrode that includes a drain main portion superimposed with the conductive line main portion, a first drain branch portion branching from the drain main portion and superimposed with the first conductive line branch portion, and a second drain branch portion branching from the drain main portion and superimposed with the fourth conductive line branch portion,
a disposed region of the first drain branch portion is partly shifted from a disposed region of the first conductive line branch portion, and
a disposed region of the second drain branch portion is partly shifted from a disposed region of the fourth conductive line branch portion.

2. The active matrix substrate according to claim 1, wherein a disposed region of the drain main portion is partly shifted from a disposed region of the conductive line main portion.

3. A liquid crystal display device comprising:
the active matrix substrate according to claim 1;
a counter substrate facing the active matrix substrate; and
a liquid crystal layer held between the active matrix substrate and the counter substrate.

4. The liquid crystal display device according to claim 3, wherein liquid crystal molecules in the liquid crystal layer with voltage applied to the liquid crystal layer are aligned divisionally into at least four domains with different inclination azimuths in a pixel region defined by the pixel electrode.

5. The liquid crystal display device according to claim 4, wherein the conductive line branch portions further include a fifth conductive line branch portion extending in the second direction between the first conductive line branch portion and the third conductive line branch portion and a sixth conductive line branch portion extending in a direction opposite to the fifth conductive line branch portion between the second conductive line branch portion and the fourth conductive line branch portion, and
the fifth conductive line branch portion and the sixth conductive line branch portion are each superimposed with a boundary between the at least four domains.

6. An active matrix substrate comprising:
a first gate bus line and a second gate bus line each extending in a first direction;
a first source bus line and a second source bus line each extending in a second direction intersecting the first direction;
a pixel electrode disposed in a region partitioned by the first gate bus line, the second gate bus line, the first source bus line, and the second source bus line; and
an auxiliary capacitance bus line including a conductive line main portion and conductive line branch portions branching from the conductive line main portion,
the conductive line main portion extending in the first direction to intersect the first source bus line and the second source bus line,
the conductive line branch portions including a first conductive line branch portion superimposed with a first end of the pixel electrode and extending in the second direction along the first source bus line, a second conductive line branch portion superimposed with the first end of the pixel electrode and extending in a direction opposite to the first conductive line branch portion, a third conductive line branch portion superimposed with a second end of the pixel electrode and extending in the second direction along the second source bus line, and a fourth conductive line branch portion superimposed with the second end of the pixel electrode and extending in a direction opposite to the third conductive line branch portion,
one of the first conductive line branch portion and the second conductive line branch portion having a longer length in the first direction than the other conductive line branch portion,
one of the third conductive line branch portion and the fourth conductive line branch portion having a longer length in the first direction than the other conductive line branch portion, wherein:
the first conductive line branch portion has a longer length in the first direction than the second conductive line branch portion,
the fourth conductive line branch portion has a longer length in the first direction than the third conductive line branch portion,
the active matrix substrate further comprises a thin film transistor element connected to the first gate bus line and the first source bus line,
the thin film transistor element includes a drain electrode that includes a drain main portion superimposed with the conductive line main portion, a first drain branch portion branching from the drain main portion and superimposed with the first conductive line branch portion, and a second drain branch portion branching from the drain main portion and superimposed with the fourth conductive line branch portion,
a disposed region of the drain main portion is partly shifted from a disposed region of the conductive line main portion.

7. A liquid crystal display device comprising:
the active matrix substrate according to claim 6;
a counter substrate facing the active matrix substrate; and
a liquid crystal layer held between the active matrix substrate and the counter substrate.

8. The liquid crystal display device according to claim 7, wherein liquid crystal molecules in the liquid crystal layer with voltage applied to the liquid crystal layer are aligned divisionally into at least four domains with different inclination azimuths in a pixel region defined by the pixel electrode.

9. The liquid crystal display device according to claim 8, wherein the conductive line branch portions further include a fifth conductive line branch portion extending in the second direction between the first conductive line branch portion and the third conductive line branch portion and a sixth conductive line branch portion extending in a direction opposite to the fifth conductive line branch portion between the second conductive line branch portion and the fourth conductive line branch portion, and the fifth conductive line branch portion and the sixth conductive line branch portion are each superimposed with a boundary between the at least four domains.

* * * * *